United States Patent
Kramer et al.

(10) Patent No.: US 10,703,925 B2
(45) Date of Patent: Jul. 7, 2020

(54) ELECTRICALLY-CONDUCTIVE INK FORMULATIONS CONTAINING MICROCRYSTALLINE CELLULOSE, METHODS OF PRINTING ELECTRICALLY-CONDUCTIVE TRACES, AND LAMINATES CONTAINING THE SAME

(71) Applicant: The Diller Corporation, Cincinnati, OH (US)

(72) Inventors: Robert Jacob Kramer, Franklin, OH (US); Kevin Francis O'Brien, Cincinnati, OH (US)

(73) Assignee: THE DILLER CORPORATION, Cincinnati, OH (US)

( * ) Notice: Subject to any disclaimer, the term of this patent is extended or adjusted under 35 U.S.C. 154(b) by 0 days.

(21) Appl. No.: 15/951,709

(22) Filed: Apr. 12, 2018

(65) Prior Publication Data
US 2018/0298220 A1  Oct. 18, 2018

Related U.S. Application Data

(60) Provisional application No. 62/485,153, filed on Apr. 13, 2017.

(51) Int. Cl.
| | | |
|---|---|---|
| H01B 1/04 | (2006.01) | |
| C09D 11/52 | (2014.01) | |
| H01B 1/02 | (2006.01) | |
| H01B 1/22 | (2006.01) | |
| C09D 11/14 | (2006.01) | |
| H05K 1/09 | (2006.01) | |
| C09D 11/037 | (2014.01) | |
| C09D 11/102 | (2014.01) | |
| H05K 1/02 | (2006.01) | |

(52) U.S. Cl.
CPC ............ *C09D 11/52* (2013.01); *C09D 11/037* (2013.01); *C09D 11/102* (2013.01); *C09D 11/14* (2013.01); *H01B 1/02* (2013.01); *H01B 1/04* (2013.01); *H01B 1/22* (2013.01); *H05K 1/095* (2013.01); *H05K 1/0296* (2013.01); *H05K 1/097* (2013.01)

(58) Field of Classification Search
CPC . C09D 11/52; H01B 1/02; H01B 1/04; H01B 1/22; H05K 1/0296; H05K 1/095; H05K 1/097
See application file for complete search history.

(56) References Cited

U.S. PATENT DOCUMENTS

| | | | | |
|---|---|---|---|---|
| 2008/0044651 | A1* | 2/2008 | Douglas | B82Y 10/00 428/339 |
| 2009/0035707 | A1* | 2/2009 | Wang | C09D 5/24 430/322 |
| 2010/0266896 | A1* | 10/2010 | Stromme | C08J 7/047 429/209 |
| 2011/0300305 | A1* | 12/2011 | Li | C23C 24/08 427/553 |
| 2013/0001477 | A1* | 1/2013 | Kimura | C08B 15/02 252/510 |
| 2013/0122533 | A1* | 5/2013 | Pitchai-Mydeen | C08J 5/18 435/28 |
| 2013/0264019 | A1* | 10/2013 | Helgesen | D21H 13/46 162/102 |
| 2014/0203223 | A1* | 7/2014 | Ikada | B32B 15/08 252/514 |
| 2017/0349481 | A1* | 12/2017 | Lacroix | C03C 17/007 |

OTHER PUBLICATIONS

Product Overview: Avicel® RC-591 (Year: 2003).*
Braun, et al. Rheology Modifiers Handbook Practical Use and Application William Andrew Publishing, 106, 2000 (Year: 2000).*

\* cited by examiner

*Primary Examiner* — Mark Kopec
*Assistant Examiner* — Jaison P Thomas
(74) *Attorney, Agent, or Firm* — Ice Miller LLP

(57) ABSTRACT

Electrically-conductive ink compositions comprising: (i) a particulate, electrically-conductive material; (ii) a carrier liquid; (iii) a polymer binder; and (iv) a microcrystalline cellulose component; methods comprising: (a) providing a substrate; (b) providing an electrically-conductive ink formulation comprising (i) a particulate, electrically-conductive material; (ii) a carrier liquid; (iii) a polymer binder; and (iv) a microcrystalline cellulose component; and (c) forming an electrically-conductive trace on a surface of the substrate; and articles comprising a substrate having a surface and an electrically-conductive trace formed on the surface of the substrate, wherein the electrically-conductive trace comprises: (a) a particulate, electrically-conductive material; (b) a polymer binder; and (c) a microcrystalline cellulose component are described.

29 Claims, No Drawings

ELECTRICALLY-CONDUCTIVE INK FORMULATIONS CONTAINING MICROCRYSTALLINE CELLULOSE, METHODS OF PRINTING ELECTRICALLY-CONDUCTIVE TRACES, AND LAMINATES CONTAINING THE SAME

CROSS-REFERENCE TO RELATED APPLICATIONS

This application claims the benefit of U.S. Provisional Patent Application No. 62/485,153, filed Apr. 13, 2017, the entire contents of which are hereby incorporated herein by reference.

BACKGROUND OF THE INVENTION

Conductive ink formulations can be used to form patterned lines or traces on various substrates. The conductive ink formulations can be deposited on the substrate in various patterns, using methods such as printing. The electrically-conductive component of such ink formulations is generally a metal or another conductive material. A commonly used metal is silver. Accordingly, the cost associated with using such formulations to create printed conductive traces can be high. Additionally, demand for printed traces with better conductivity continues to grow.

Therefore, it is desirable to provide electrically-conductive ink formulations that exhibit improved conductivity when deposited as traces on substrates, and which require use of smaller quantities of costly materials.

BRIEF SUMMARY OF THE INVENTION

The present invention is directed, in general, to electrically-conductive ink formulations that contain microcrystalline cellulose, methods of forming electrically-conductive traces on various substrates using the inventive formulations, and laminates prepared using substrates having such an electrically-conductive trace formed thereon as one or more layers of the laminate. Various embodiments of the present invention thus provide inks which can be formed into electrically-conductive traces on various substrates, preferably by printing, and which are useful as circuitry or circuit elements, and which exhibit improved conductivity and, at the same time, require decreased content of expensive electrically-conductive materials. Electrically-conductive ink formulations according to the various embodiments of the invention can provide electrically-conductive traces with improved conductivity, better physical properties and decreased electrically-conductive material content.

One embodiment of the present invention includes an electrically-conductive ink composition comprising: (i) a particulate, electrically-conductive material; (ii) a carrier liquid; (iii) a polymer binder; and (iv) a microcrystalline cellulose component. Another embodiment of the present invention includes an electrically-conductive ink composition comprising: (i) a particulate, electrically-conductive material; (ii) a carrier liquid; (iii) a polymer binder; and (iv) a microcrystalline cellulose component; wherein the particulate, electrically-conductive material comprises a component selected from the group consisting of silver and silver alloys; and wherein the microcrystalline cellulose component is present in an amount of from about 0.05% to about 10% by weight based on the composition and has an average particle size of from about 20 to about 100 μm. Another embodiment of the present invention includes a method comprising: (a) providing a substrate; (b) providing an electrically-conductive ink formulation comprising (i) a particulate, electrically-electrically-conductive material, (ii) a carrier liquid, (iii) a polymer binder, and (iv) a microcrystalline cellulose component; and (c) forming an electrically-conductive trace on a surface of the substrate, preferably by printing. In various preferred embodiments of the methods of the present invention, the electrically-conductive trace formed on the surface of the substrate is subjected to elevated temperature and pressure for compaction. Yet another embodiment of the present invention includes a laminate comprising a first substrate layer and at least a second substrate layer, wherein at least one surface of one of the first and second substrate layers has an electrically-conductive trace printed thereon, wherein the electrically-conductive trace is disposed between the first and second substrate layers in a stacked, compressed relationship, and wherein the electrically-conductive trace comprises a particulate, electrically-conductive material and a microcrystalline cellulose component.

In various preferred embodiments of the present invention, the particulate, electrically conductive material comprises a silver or silver alloy component. In certain more preferred embodiments of the invention, the electrically-conductive ink formulation comprises a silver or silver alloy component that includes flakes or platelets of silver. In various embodiments of the present invention, the microcrystalline cellulose is present in an amount up to about 20% by weight, based on the ink formulation. In certain preferred embodiments of the present invention, the microcrystalline cellulose is present in an amount of from about 0.5% to about 10% by weight, based on the ink formulation. Various preferred microcrystalline cellulose components for use in various embodiments of the invention have average particle size of from about 20 to about 100 μm. In certain preferred embodiments of the invention, the microcrystalline cellulose component may include two or more microcrystalline celluloses having different average particle sizes. In various preferred embodiments of the present invention, the carrier liquid may comprise a hydrophilic solvent, and may further include various additives such as rheology modifiers and pH modifiers. In various preferred embodiments of the present invention, the polymer binder may comprise a thermoplastic polyether resin with a decomposition temperature greater than about 140° C.

In various preferred embodiments of the present invention directed to methods of forming electrically-conductive traces using the various inventive ink formulations, the substrate can comprise paper, and in more preferred embodiments, kraft paper. In various preferred embodiments, the substrates can comprise resin-impregnated kraft paper. In various preferred embodiments of the present invention directed to methods of forming electrically-conductive traces using the various inventive ink formulations, the printing can be carried out using ink-jet or extrusion printing. Printed electrically-conductive traces are subjected to drying and compaction.

Methods of pressing stacked layers to form laminates and various electrically-conductive trace patterns and interconnections for multiple traces on separate layers suitable for use in the various embodiments of the present invention are described in U.S. Patent Application Publication No. 2016/0104566, the entire contents of which are incorporated herein by reference.

Other aspects, features and advantages will be apparent from the following disclosure, including the detailed description, preferred embodiments, and the appended claims.

DETAILED DESCRIPTION OF THE INVENTION

As used herein, the singular terms "a" and "the" are synonymous and used interchangeably with "one or more" and "at least one," unless the language and/or context clearly indicates otherwise. Accordingly, for example, reference to "a particulate, electrically-conductive material" or "the particulate, electrically-conductive material" herein or in the appended claims can refer to a single material or more than one material. Additionally, all numerical values, unless otherwise specifically noted, are understood to be modified by the word "about."

Electrically-conductive ink formulations in accordance with the various embodiments of the present invention include a particulate, electrically-conductive material. Suitable particulate, electrically-conductive materials include, but are not limited to, particles, flakes, dusts and powders, and the like comprised of one or more metals, metal alloys, electrically-conductive allotropes of carbon, and mixtures thereof. Particulate, electrically-conductive materials suitable for use in the various embodiments of the present invention may also include nano-sized particles including nanorods, nanotubes, nanospheres and nanoplatelets. Additional suitable particulate electrically-conductive materials include micro- and/or nano-spheres and/or bubbles coated having an electrically conductive coating.

Particulate, electrically-conductive materials suitable for use in the various embodiments of the present invention generally have an average particle size of from 0.1 µm to about 1000 µm, and preferably from about 5 µm to about 250 µm. In general, in accordance with the various embodiments of the present invention, particulate, electrically-conductive materials with bimodal or multimodal particle size distributions are preferred for higher packing density. Average particle sizes from commercial vendors are generally reported as a numerical average measured by laser interferometer. Preferably, particulate, electrically-conductive materials for use in the various embodiments of the present invention will contain less than about 0.1% of particles having a particle size equal to or greater than ⅓ of the diameter of the nozzle or printing tip to be used for forming a conductive trace on a substrate.

Other preferable properties of the particulate, electrically-conductive materials suitable for use in the various embodiments of the present invention include being at least partially suspendable in and compatible with the carrier liquid and polymer binder of the formulation. Particulate, electrically-conductive materials are considered at least partially suspendable when a substantial amount of the material remains in suspension for an amount of time sufficient to form traces after preparation of the ink formulation. In the various embodiments of the present invention, the particulate, electrically-conductive material should be present in the ink formulation in an amount of from 10% by weight to about 95% by weight, based on the total weight of the formulation. The amount of conductive material can vary widely based on density, particle size and selection of a carrier liquid/polymer binder system. Thus, for example, a particulate silver material may be employed in an amount of 70-90% by weight, whereas a conductive carbon material may be employed in an amount of from 30-50% by weight. Content of particulate, electrically-conductive material in an ink formulation according to various embodiments of the present invention can be selected by one of ordinary skill in the art based on the material's density, particle size, other formulation components and the desired conductivity of the formed conductive traces. In general, electrically-conductive ink formulations can contain 10-95% by weight conductive material, 2.5 to 50% by weight carrier liquid and 2.5 to 40% by weight polymer binder, based on the total weight of those components. Particulate, electrically-conductive materials suitable for use in the various embodiments of the present invention should be at least capable of being suspended in the carrier liquid, and more preferably dispersible in the carrier liquid component, such that the desired content range is attainable. The particulate, electrically-conductive materials suitable for use in the various embodiments of the present invention generally have a bulk resistivity lower than 0.01 $\Omega \cdot m$, preferably, less than $1*10^{-5}$ $\Omega \cdot m$, more preferably, less than $1*10^{-7}$ $\Omega \cdot m$. The particulate, electrically-conductive materials suitable for use in the various embodiments of the present invention are generally non-reactive with respect to the other components of the ink formulation.

In various preferred embodiments of the present invention, the particulate, electrically-conductive material comprises silver, silver alloys, or mixtures thereof. In certain preferred embodiments of the present invention, the particulate, electrically-conductive material comprises silver particles having irregular shapes with an average particle size of from about 5 µm to about 250 µm. In certain preferred embodiments of the present invention, the particulate, electrically-conductive material comprises silver flakes or platelets having high aspect ratios (i.e., large surface area to platelet thickness) with an average particle size of from about 5 µm to about 250 µm, and more preferably, from about 5 µm to about 100 µm. In certain preferred embodiments of the present invention, the particulate, electrically-conductive material comprises silver flakes or platelets having high aspect ratios (i.e., large surface area to platelet thickness) with an average particle size of from about 5 µm to about 250 µm, and more preferably, from about 5 µm to about 100 µm, wherein less than about 0.1% of the flakes/platelets have a largest particle size dimension equal to or greater than ⅓ of the diameter of the nozzle, print tip, screen mesh or other opening in the printing device to be used for forming a conductive trace on an substrate. In various embodiments of the present invention, flakes or platelets having a high aspect ratio of surface area to thickness of greater than about 10:1, preferably greater than about 50:1, and more preferably greater than about 100:1.

Electrically-conductive ink formulations in accordance with the various embodiments of the present invention can be prepared by combining a particulate, electrically-conductive material, a carrier liquid, a polymer binder and a microcrystalline cellulose component. Alternatively, electrically-conductive ink formulations in accordance with the various embodiments of the present invention can be prepared by combining a commercially available ink containing a particulate, electrically-conductive material, a carrier liquid and a polymer binder, with a microcrystalline cellulose component. In various embodiments of the present invention, an electrically-conductive ink formulation comprises: a commercially available electrically-conductive ink such as, for example, DuPont 5029; combined with a microcrystalline cellulose material.

Electrically-conductive ink formulations in accordance with the various embodiments of the present invention include a carrier liquid. Carrier liquids suitable for use in accordance with the various embodiments of the present invention include solvents and water which are compatible with and dissolve the binder, while not degrading the conductive material or microcrystalline cellulose component. In various embodiments of the present invention, a carrier liquid comprises a hydrophilic solvent such as, for example, a dialkylene glycol ether. Particularly preferred solvents suitable for use as the carrier liquid in the various embodiments of the present invention include, but are not limited to, propylene glycol ether, dipropylene glycol ether and mixtures thereof, particularly preferably the methyl ether forms thereof. Preferred solvents for use in the various embodiments of the present invention can be selected from nontoxic and/or low-volatility solvent that provide environmentally acceptable properties.

Electrically-conductive ink formulations in accordance with the various embodiments of the present invention include binders and may further include other additives. Polymer binders suitable for use in accordance with the various embodiments of the present invention include thermoplastic and thermoset resins having thermal decomposition temperatures above about 140° C., preferably above about 160° C., and more preferably above about 200° C. Preferably, thermoplastic resins are used. Suitable polymer binders include acrylics, vinyls, polyethers, polyesters, polyamides, polyimides, phenolics and the like. Copolymers and polymer blends may also be used. Suitable polymer binders may comprise conductive polymers such as polyacetylene, PEDOT:PSS and polyaniline. In various preferred embodiments of the present invention, the polymer binder comprises a polyether. In various preferred embodiments of the present invention, the polymer binder comprises a phenyl group-containing polyether resin. Polymer binders suitable for use in the present invention should preferably have a melting point above about 70° C., and after removal of the carrier liquid component, should exhibit flowability in pressing/compacting conditions described herein. The content of polymer binder in the conductive ink formulations according to the various embodiments of the present invention may vary widely and is dependent on the selected conductive material and carrier liquid.

Electrically-conductive ink formulations in accordance with the various embodiments of the present invention may also include various additives including, but not limited to, rheological modifiers, fillers/extenders, crosslinking agents, wet strength modifiers, plasticizers, radical scavengers/UV protectants, emulsifiers, and pH modifiers and buffers such as sodium carbonate. Polymeric binders and additives may be present in electrically-conductive inks which are commercially obtained and combined with microcrystalline cellulose in accordance with the present invention, or they may be individually produced or obtained and combined with the particulate, electrically-conductive material, carrier liquid and microcrystalline cellulose of the inventive ink formulations. Various known additives, carrier liquids (solvents) and polymer binders suitable for use in conductive ink formulations in accordance with the various embodiments of the present invention are described in U.S. Patent App. Pub. No. 2016/0009976A1, the entire contents of which are incorporated herein by reference.

Electrically-conductive ink formulations in accordance with the various embodiments of the present invention comprise a microcrystalline cellulose component. Modified and/or unmodified microcrystalline cellulose can be used, but preferably unmodified (i.e., not chemically-modified, not separately functionalized) microcrystalline cellulose is used. The microcrystalline cellulose component can be powdered or colloidal. Preferably, a powdered microcrystalline cellulose component is used. A particularly preferred microcrystalline cellulose component is Vivapur® 101, which is commercially available from JRS Pharma GmbH & Co. KG, Rosenberg, Germany. Suitable microcrystalline cellulose components for use in accordance with the various embodiments of the present invention generally have an average particle size of from about 5 to about 250 µm, preferably from about 5 to about 100 µm, more preferably from about 10 to about 100 µm, and still more preferably from about 20 to about 100 µm. In certain preferred embodiments in accordance with the present invention, the microcrystalline cellulose component comprises an unmodified, powdered microcrystalline cellulose component having an average particle size of from about 20 to about 100 µm.

The electrically-conductive ink formulations in accordance with the various embodiments of the present invention generally comprise a microcrystalline cellulose component in an amount up to about 20% by weight, based on the total formulation. Preferably, the microcrystalline cellulose component is present in an amount of from about 0.1% to about 15% by weight, more preferably from about 0.1% to about 10%, still more preferably from about 0.5% to about 10% by weight, and still more preferably from about 0.5% to about 5% by weight, based on the total formulation. Microcrystalline cellulose components can be obtained commercially from, for example, JRS Pharma, FMC and Blanver, or can be prepared by a number of methods known in the art. Preferably, the moisture content of the microcrystalline cellulose component is low, and more preferably, the moisture content of the microcrystalline cellulose component is less than 1.5%.

Microcrystalline cellulose components for use in the various embodiments of the present invention can include two or more microcrystalline celluloses having different average particle sizes. In certain preferred embodiments of the present invention, electrically-conductive ink formulations comprise two microcrystalline cellulose components. In certain preferred embodiments, one microcrystalline cellulose component has an average particle size of from about 10 to about 50 µm, and a second microcrystalline cellulose component has an average particle size of from about 50 to about 100 µm. In general, in the various embodiments of the present invention in which the microcrystalline cellulose component includes larger particle size cellulose component(s), such larger particle size microcrystalline cellulose component(s) should be present in the highest amount possible before entanglement of the cellulose fibers becomes a viscosity hindrance to printing or otherwise adversely impacts processing in accordance with the various embodiments of the present invention, which may depend upon the overall formulation and any chosen printing equipment. In the various preferred embodiments of the present invention wherein the microcrystalline cellulose component comprise two or more microcrystalline celluloses, the total amount of microcrystalline cellulose present in the formulation is still within the ranges recited above.

Electrically-conductive ink formulations in accordance with the various embodiments of the present invention can be prepared by mixing the components together and blending. A combination of shear rate and blending time must be selected to ensure complete dispersing of the microcrystalline cellulose in the ink formulation. However, the shear rate must not be so great that the microcrystalline cellulose particle size is decreased outside the range of still being microcrystalline cellulose. Thus, any combination of shear rate and blending time which fully disperses the microcrystalline cellulose without reducing its average particle size to a nanoscale is suitable for use in preparing formulations in accordance with the various embodiments of the present invention.

The present invention also includes methods which comprise(a) providing a substrate; (b) providing an electrically-conductive ink formulation comprising (i) a particulate, electrically-conductive material; (ii) a carrier liquid; (iii) a polymer binder; and (iv) a microcrystalline cellulose component; and (c) forming an electrically-conductive trace on a surface of the substrate. Forming an electrically-conductive trace on a surface of a substrate is preferably carried out by printing the electrically-conductive ink formulation in a desired pattern, for example, but not limited to screen printing and extrusion printing. More preferably, printing is carried out using extrusion printing.

Suitable substrates for use in the various method embodiments of the present invention include, but are not limited to, plastic films, papers, silicon wafers and plates, as well as other semiconductor materials, both doped and undoped. Substrates for use in various preferred method embodiments of the present invention comprise paper. In various preferred embodiments of the methods according to the present invention, the paper substrate can be resin-impregnated. Suitable paper substrates can be impregnated with resin before or after an electrically-conductive trace is printed on a surface of the paper substrate. In various embodiments of the present invention directed to laminates of multiple layers of substrates, electrically-conductive trace can be formed on a surface of one substrate and sandwiched between two resin-impregnated substrates. Suitable paper which may be used in resin-impregnated paper layers in accordance with the various embodiments of the present invention, include but are not limited to: cellulose (e.g., tree pulp, wood pulp, plant pulp etc.) fiber, synthetic woven or non-woven fiber, or/and microfiber or/and nanofiber, mixtures of cellulose or/and synthetic fiber based papers or/and mineral fiber based papers or/and glass fiber based papers, coated or non-coated, pre-impregnated or non pre-impregnated that could be generally used in the production of decorative laminates, including both high pressure laminates and low pressure laminates. In various embodiments of the present invention, paper suitable for use as resin-impregnated paper substrates has at least one, and preferably all of the following properties: a minimum wet strength in the machine direction of 1400 cN/30 mm in accordance with the test method of the International Standard DIN ISO 3781, a Klemm absorbency range (capillary rise) in the machine direction of 30 to 90 mm/10 min in accordance with the test method of the International Standard DIN ISO 8787 with a preferred absorbency of 45 mm/10 mim, Ash content 0 to 50% depending of the intrinsic nature of the paper used in accordance with the test method of the International Standard Din ISO 2144, a basis weight range of 10 to 300 g/m2 at moisture content range of 2 to 8% in accordance the test method of the International Standard DIN ISO 536, a pH (on hot extract) of 4 to 9 in accordance with the test method of the International Standard DIN ISO 6588. In various embodiments of the present invention, papers comprising at least a portion of recycled materials may be used.

Printing in accordance with the various embodiments of the present invention can be carried out by any method suitable for forming traces of desired resolution, line spacing and thickness. Minimum line spacing between conductive traces in accordance with the various embodiments of the present invention is generally at least about 0.1 mm, and is dependent upon the viscosity of the ink formulation and the thickness of the conductive trace. In certain preferred embodiments according to the present invention, conductive traces having a width of about 1.3-1.5 mm, a thickness of about 1 mm, and a line spacing of about 0.5 mm are formed on a surface of a substrate, Preferably, printing is carried out using an extrusion, screen or ink jet printing apparatus. In various preferred embodiments, printing is carried out using an extrusion plotter with a syringe-based, robotic dispensing unit. Nozzle configurations and dimensions can be selected based on viscosity and particle size parameters of the conductive ink formulation, as well as the desired trace width and thickness.

In the various embodiments of the methods according to the present invention, the electrically-conductive traces are dried and compacted after printing. Drying is preferably carried out with heat. The duration and temperature of drying can vary depending on the carrier liquid, the polymer binder, their content levels and the thickness of the conductive trace. In general, the thicker the conductive trace, the slower and longer the drying time in order to ensure all carrier liquid is driven off. Moreover, drying temperatures should not exceed the decomposition temperature of the polymer binder. Drying and compacting in accordance with various embodiments of the present invention can each be carried out in one or more steps, sequentially in any order or simultaneously. In other words, any combination of one or more drying steps and one or more compacting steps can be performed. For example, in various embodiments, complete drying can be carried out along with partial compaction, followed by subsequent additional compacting steps. In various preferred embodiments of the present invention, the conductive trace is dried in two or more stages using increasing temperatures.

In the various embodiments of the methods according to the present invention, the electrically-conductive traces are compacted. As mentioned above, drying and compaction may be carried out in one or more steps, sequentially or simultaneously. Compaction of the conductive traces can be carried out using any high pressure compaction equipment including, for example, high pressure squeeze rollers, recooling presses and the like. Compaction can be carried out at pressures of from about 1000 psi to about 4000 psi, for seconds up to hours. In various embodiments according to the present invention, compaction is carried out for 30-45 minutes at a pressure of about 1200 to 1500 psi, Additionally, in various embodiments according to the present invention, drying may continue during compaction. Additionally, in accordance with various embodiments of the present invention, compaction may be carried out in multiple stages or steps wherein a combination of low pressure and high pressure compaction is employed such that at least one step of the two or more compaction steps is carried out with higher pressure (i.e., greater than about 1000 psi).

As described above, various embodiments in accordance with the present invention include a single substrate having a conductive trace formed thereon from an electrically-conductive ink formulation in accordance with one or more embodiments of the present invention. The present invention also includes laminates comprising a first substrate layer and a second substrate layer, wherein at least one surface of at least one of the first and second substrate layers has an electrically-conductive trace printed thereon, wherein the electrically-conductive trace is disposed between the first and second substrate layers in a stacked, compressed relationship, and wherein the electrically-conductive trace comprises a particulate, electrically-conductive material, a polymer binder, and a microcrystalline cellulose component.

Laminates in accordance with the various embodiments of the present invention include a layer, which is preferably a paper substrate as described above, having an electrically-conductive trace printed on a surface thereof using an electrically-conductive ink formulation in accordance with an embodiment of the present invention. At least one layer having such an electrically-conductive trace is stacked with at least one additional layer, at least one of the layers comprising a resin-impregnated paper layer, and compressed with heat and pressure to form a laminate. Suitable processes for such lamination, laminates structures and suitable conductive trace designs are described in U.S. Patent Application Publication No. 2016/0104566, incorporated in its entirety herein by reference. Lamination with heat and pressure may be carried out in addition to, or in place of separate drying and compaction of individual substrates having conductive traces formed thereon.

The invention will now be described in further detail with reference to the following non-limiting examples.

EXAMPLES

Comparative Example 1

Five traces of DuPont 5029 ink were printed, each trace having a length of 514.8 mm at a deposition of 2.0 g of ink per meter, on 185 gsm kraft paper from International Paper, using an extrusion printing apparatus including a Loctite 500-D series robotic dispensing unit and a syringe-based nozzle output, the nozzle having a 0.8 mm opening using an 18 gauge stainless steel, luer-lock needle for ink dispensing. The traces were dried for 3 minutes at ~100° C., then for 3 minutes at ~125° C., and then for 5 minutes at ~150° C. This sheet of kraft paper with the dried traces was then pressed in a 18×20 high pressure recooling press for 30 minutes at 1250 psi, reaching a peak temperature of 134° C. for 4-7 minutes. The resistances of the resultant ink traces were then measured with a digital multimeter. The measured resistances ranged from 0.11Ω to 0.15Ω, averaging 0.12Ω.

Example 1

An ink ("Ink A") in accordance with an embodiment of the present invention was prepared using the same DuPont 5029 ink used in Comparative Example 1, with the addition of 1% by weight, based on the total composition, of a microcrystalline cellulose having an average particle size of 65 μm and 3% by weight, based on the total composition, of a microcrystalline cellulose having an average particle size of 40 μm. The DuPont 5029 ink and the microcrystalline celluloses were blended using mechanical stirring. Five traces of Ink A were printed, each trace having a length of 514.8 mm at a deposition of 2.0 g of ink per meter, on 185 gsm kraft paper from International Paper, using an extrusion printing apparatus including a Loctite 500-D series robotic dispensing unit and a syringe-based nozzle output, the nozzle having a 0.8 mm opening using an 18 gauge stainless steel, luer-lock needle for ink dispensing. The traces were dried for 3 minutes at ~100° C., then for 3 minutes at ~125° C., and then for 5 minutes at ~150° C. This sheet of kraft paper with the dried traces was then pressed in an 18×20 high pressure recooling press for 30 minutes at 1250 psi, reaching a peak temperature of 134° C. for 4-7 minutes. The resistances of the resultant ink traces were then measured with a digital multimeter. The measured resistances ranged from 0.09Ω to 0.12Ω, averaging 0.11Ω.

The observed reduction in resistance is a significant improvement in conductivity of the traces, particularly when the amount of electrically-conductive material is considered. DuPont 5029 ink contains 80-85% by weight silver. Accordingly, Ink A, after addition of microcrystalline cellulose, is 72-78% by weight silver. Thus, the silver used per meter of the DuPont 5029 traces in Comparative Example 1 was 1.60 g-1.70 g, while Ink A used only 1.44 g-1.56 g/m. Therefore, inventive Ink A achieves a lower resistance (higher conductivity) using less silver. Reducing silver content should have an inverse, exponential relationship with conductivity, because less silver volume should mean a less connected network of silver particles. Electrically-conductive ink formulations in accordance with various embodiments of the present invention exhibit lower conductive particle content, but achieve higher conductivities.

Using the calculated average cross-sectional area of the traces evaluated in Comparative Example 1 and Example 1, the bulk resistivities were determined. The calculated average cross-sectional area of the traces was 0.224 mm². Based on this cross-sectional area, the length of the traces and the measured resistances, the bulk resistivity of the traces in Comparative Example 1 is calculated to be $6.06*10^{-8}$ Ωm. This bulk resistivity is 3.6 times that of bulk copper. Based on this cross-sectional area, the length of the traces and the measured resistances, the bulk resistivity of the traces in Example 1 is calculated to be $5.55*10^{-8}$ Ωm. This bulk resistivity is 3.3 times that of bulk copper. This is an approximately 10% reduction in resistivity along with a 3% reduction in silver used. These advantages over the prior art are significant and unexpected in the art.

Additionally, RLC meter measurements of the ink formulation traces in accordance with various embodiments of the present invention at various frequencies from 1 kHz to 10 MHz exhibit lower than expected impedance. This is an additional advantage of the inventive inks over prior art electrically-conductive inks because the lower than expected impedance under high frequency AC loads permits use of the inventive inks for printing circuits used in a wider range of applications, and provides higher efficiency and stronger signals.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. An electrically-conductive ink composition comprising: (i) metal-containing, particulate, electrically-conductive flakes or platelets having a high aspect ratio greater than about 10:1; (ii) a carrier liquid; (iii) a polymer binder; and (iv) a microcrystalline cellulose component.

2. The electrically-conductive ink composition according to claim 1, wherein the particulate, electrically-conductive flakes or platelets comprise a component whose bulk resistivity is lower than 0.01 Ω·m.

3. The electrically-conductive ink composition according to claim 1, wherein the particulate, electrically-conductive flakes or platelets comprise a component whose bulk resistivity is lower than $1*10^{-5}$ Ω·m.

4. The electrically-conductive ink composition according to claim 1, wherein the particulate, electrically-conductive flakes or platelets comprise a component whose bulk resistivity is lower than $1*10^{-7}$ Ω·m.

5. The electrically-conductive ink composition according to claim 1, further comprising a component selected from the group consisting of additional metals, alloys, conductively-coated spheres and electrically-conductive carbon.

6. The electrically-conductive ink composition according to claim 1, wherein the particulate, electrically-conductive flakes or platelets comprise a component selected from the group consisting of silver and silver alloys.

7. The electrically-conductive ink composition according to claim 6, the microcrystalline cellulose component is present in an amount of from about 0.05% to about 10% by weight based on the composition.

8. The electrically-conductive ink composition according to claim 7, wherein the microcrystalline cellulose component has an average particle size of from about 20 μm to about 100 μm.

9. The electrically-conductive ink composition according to claim 1, wherein the microcrystalline cellulose component is present in an amount up to about 20% by weight based on the composition.

10. The electrically-conductive ink composition according to claim 1, wherein the microcrystalline cellulose component comprises an unmodified, powdered microcrystalline cellulose having an average particle size of from about 5 μm to about 250 μm.

11. The electrically-conductive ink composition according to claim 1, wherein the microcrystalline cellulose component is present in an amount of from about 0.01% to about 10% by weight based on the composition.

12. The electrically-conductive ink composition according to claim 1, wherein the microcrystalline cellulose component is present in an amount of from about 0.05% to about 10% by weight based on the composition.

13. The electrically-conductive ink composition according to claim 12, wherein the microcrystalline cellulose component has an average particle size of from about 20 μm to about 100 μm.

14. The electrically-conductive ink composition according to claim 12, wherein the microcrystalline cellulose component comprises two or more microcrystalline cellulose materials having different average particle sizes.

15. The electrically-conductive ink composition according to claim 1, wherein the microcrystalline cellulose component has an average particle size of from about 20 μm to about 100 μm.

16. The electrically-conductive ink composition according to claim 1, wherein the microcrystalline cellulose component comprises two or more microcrystalline cellulose materials having different average particle sizes.

17. A method comprising:
(a) providing a substrate;
(b) providing an electrically-conductive ink formulation according to claim 1 and
(c) forming an electrically-conductive trace on a surface of the substrate.

18. The method according to claim 17, wherein forming the electrically-conductive trace on a surface of the substrate comprises printing.

19. The method according to claim 17, wherein forming the electrically-conductive trace on a surface of the substrate comprises extrusion printing.

20. The method according to claim 17, further comprising drying and compacting, in one or more steps, sequentially in any order or simultaneously, the formed electrically-conductive trace.

21. An article comprising a substrate having a surface and an electrically-conductive trace formed on the surface of the substrate, wherein the electrically-conductive trace comprises an electrically-conductive ink formulation according to claim 1.

22. The article according to claim 21, wherein the electrically-conductive trace is at least partly dried and compacted.

23. A high pressure laminate comprising a first substrate layer and a second substrate layer, wherein at least one surface of at least one of the first and second substrate layers has an electrically-conductive trace formed thereon, wherein the electrically-conductive trace is disposed between the first and second substrate layers in a stacked relationship having been subjected to compaction at a pressure of at least about 1000 psi to form the high pressure laminate, and wherein the electrically-conductive trace comprises a composition according to claim 1.

24. The electrically-conductive ink composition according to claim 1 wherein the electrically-conductive material is comprised of silver flakes or platelets.

25. A electrically-conductive ink composition comprising: (i) a particulate, electrically-conductive material; (ii) a carrier liquid; (iii) a polymer binder; and (iv) a microcrystalline cellulose component; wherein the particulate, electrically-conductive material comprises a component selected from the group consisting of silver flakes and silver platelets; and wherein the microcrystalline cellulose component comprises an unmodified microcrystalline cellulose powder and is present in an amount of from about 0.05% to about 10% by weight based on the composition and has an average particle size of from about 20 to about 100 μm.

26. The electrically-conductive ink composition according to claim 25, wherein the carrier liquid comprises a polar solvent, and the polymer binder comprises a thermoplastic polymer.

27. The electrically-conductive ink composition according to claim 25, wherein the carrier liquid comprises a dialkylene glycol ether, and the polymer binder comprises a phenyl-containing polyether resin.

28. A method comprising:
(a) providing a substrate;
(b) providing an electrically-conductive ink formulation comprising (i) a particulate, electrically-conductive material; (ii) a carrier liquid; (iii) a polymer binder; and (iv) a microcrystalline cellulose component; and
(c) extrusion printing an electrically-conductive trace on the substrate.

29. A method comprising:
(a) providing a substrate
(b) providing an electrically-conductive ink formulation comprising (i) a particulate, electrically-conductive material; (ii) a carrier liquid; (iii) a polymer binder; and (iv) a microcrystalline cellulose component;
(c) forming an electrically-conductive trace on the substrate; and
(d) drying and compacting, in one or more steps, sequentially in any order or simultaneously, the formed electrically-conductive trace, wherein compacting comprises applying a pressure of at least about 1000 psi to the substrate and formed electrically-conductive trace.

* * * * *